(12) United States Patent
Hwang et al.

(10) Patent No.: US 12,297,545 B2
(45) Date of Patent: May 13, 2025

(54) APPARATUS AND METHOD OF TREATING SUBSTRATE

(71) Applicant: SEMES CO., LTD., Chungcheongnam-do (KR)

(72) Inventors: Jun Kil Hwang, Gyeonggi-do (KR); Min Jung Kim, Chungcheongnam-do (KR); Hee Hwan Kim, Sejong-si (KR); Seong Soo Lee, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 329 days.

(21) Appl. No.: 18/146,489

(22) Filed: Dec. 27, 2022

(65) Prior Publication Data
US 2023/0203672 A1    Jun. 29, 2023

(30) Foreign Application Priority Data

Dec. 27, 2021    (KR) .................. 10-2021-0188982
Feb. 16, 2022    (KR) .................. 10-2022-0020262

(51) Int. Cl.
*C23F 1/46*        (2006.01)
*B08B 3/02*        (2006.01)
(Continued)

(52) U.S. Cl.
CPC ............... *C23F 1/46* (2013.01); *B08B 3/022* (2013.01); *B08B 3/041* (2013.01); *B08B 3/08* (2013.01);
(Continued)

(58) Field of Classification Search
CPC . C23F 1/46; B08B 3/022; B08B 3/041; B08B 3/08; B08B 2203/007;
(Continued)

(56) References Cited

U.S. PATENT DOCUMENTS 11,728,188 B2 *   8/2023  Hashimoto ............... B08B 3/08
                                                  134/57 R
2018/0308706 A1 * 10/2018  Hinode ............. H01L 21/67253
(Continued)

FOREIGN PATENT DOCUMENTS

CN            105280523 B  *  3/2018  ....... H01L 21/67017
KR      10-2012-0016954 A      2/2012
(Continued)

OTHER PUBLICATIONS

CN-105280523-B, Machine Translation (Year: 2024).*

*Primary Examiner* — Duy Vu N Deo
*Assistant Examiner* — Christopher Remavege
(74) *Attorney, Agent, or Firm* — Carter, DeLuca & Farrell LLP

(57) ABSTRACT

Disclosed is a method of adjusting a concentration of a chemical liquid in a treatment liquid, the method including: treating a substrate by supplying a treatment liquid stored in a main tank from a nozzle in a heated state to the substrate, and recovering the treatment liquid used in the treatment of the substrate to the main tank directly or via still another tank, and then reusing the recovered treatment liquid, a concentration adjustment operation of adjusting a concentration of the treatment liquid in the main tank is performed in a standby time period in which the substrate is not treated with the treatment liquid, and the concentration adjustment operation is performed by discharging the treatment liquid in a heated state from the nozzle to evaporate a part of the diluting solution, and recovering the discharged treatment liquid to the main tank.

16 Claims, 13 Drawing Sheets

(51) Int. Cl.
*B08B 3/04* (2006.01)
*B08B 3/08* (2006.01)
*H01L 21/02* (2006.01)

(52) U.S. Cl.
CPC ... *B08B 2203/007* (2013.01); *H01L 21/02057* (2013.01)

(58) Field of Classification Search
CPC ......... H01L 21/02057; H01L 21/67017; H01L 21/32134; H01L 21/67051; H01L 21/6708
See application file for complete search history.

(56) References Cited

U.S. PATENT DOCUMENTS

| | | | |
|---|---|---|---|
| 2021/0057241 A1* | 2/2021 | Hashimoto | H01L 21/67242 |
| 2021/0368586 A1* | 11/2021 | Ogura | H01L 21/67253 |
| 2023/0187232 A1* | 6/2023 | Lee | H01L 21/67248 134/105 |

FOREIGN PATENT DOCUMENTS

| | | |
|---|---|---|
| KR | 10-2016-0027802 A | 3/2016 |
| KR | 10-2016-0076467 A | 6/2016 |
| KR | 10-2020-0077964 A | 7/2020 |

\* cited by examiner

APPARATUS AND METHOD OF TREATING SUBSTRATE

CROSS-REFERENCE TO RELATED APPLICATIONS

This application claims priority to and the benefit of Korean Patent Application Nos. 10-2021-0188982 and 10-2022-0020262 filed in the Korean Intellectual Property Office on Dec. 27, 2021 and Feb. 16, 2022 the entire contents of which are incorporated herein by reference.

TECHNICAL FIELD

The present invention relates to a substrate treating method and a substrate treating apparatus, and more particularly, to a substrate treating apparatus and a substrate treating method for treating a substrate by supplying a treatment liquid to the substrate.

BACKGROUND ART

A semiconductor process includes a process of cleaning a thin film, foreign substances, particles, and the like on a substrate. These processes are performed by placing the substrate on a spin head so that a pattern side faces up or down, supplying a treatment liquid to the substrate while rotating the spin head, and then drying the wafer.

A mixture of hydrogen peroxide and water is used as a treatment liquid in order to remove a film containing titanium, such as a titanium nitride thin film, on a substrate from the substrate. In this case, the concentration of hydrogen peroxide in the treatment liquid affects the etching rate of the titanium nitride film.

In general, the treatment liquid is stored in a main tank, the treatment liquid stored in the main tank is supplied to the substrate to treat the substrate, and the treatment liquid used for substrate treatment is recovered directly or through another tank and returned to the main tank, and reused.

In this process, the treatment liquid recovered to the main tank contains titanium or a material containing titanium. Titanium has the property of decomposing hydrogen peroxide. Accordingly, as time elapses in the main tank, the concentration of hydrogen peroxide in the treatment liquid in the main tank continuously decreases. After a lapse of a long time, when the treatment liquid in the main tank is reused to supply the substrate, the etching rate is greatly reduced when etching the titanium nitride from the substrate due to the low concentration of hydrogen peroxide.

In order to prevent this, concentration is corrected by additionally supplying hydrogen peroxide undiluted liquid to the recovered treatment liquid in the main tank. However, when the waiting time of the treatment liquid recovered from the main tank is long, the advantage of reuse is greatly reduced in terms of cost because a very large amount of newly supplied hydrogen peroxide undiluted liquid is required due to the low concentration of the hydrogen peroxide in the recovered treatment liquid.

The above-described problem occurs not only when titanium nitride is removed from a substrate with the treatment liquid containing hydrogen peroxide, but also when a thin film containing a metal other than titanium is removed.

SUMMARY OF THE INVENTION

The present invention has been made in an effort to provide a substrate treating apparatus and method capable of efficiently managing the concentration of hydrogen peroxide in a treatment liquid when the treatment liquid containing hydrogen peroxide is reused.

The object of the present invention is not limited thereto, and other objects not mentioned will be clearly understood by those of ordinary skill in the art from the following description.

An exemplary embodiment of the present invention provides is a method of treating a substrate, the method including: treating a substrate by supplying a treatment liquid stored in a main tank from a nozzle in a heated state to the substrate directly or via another tank, and recovering the treatment liquid used in the treatment of the substrate to the main tank directly or via still another tank, and then reusing the recovered treatment liquid, in which the treatment liquid includes a chemical liquid and a diluting solution, a concentration adjustment operation of adjusting a concentration of the treatment liquid in the main tank is performed in a standby time period in which the substrate is not treated with the treatment liquid, and the concentration adjustment operation is performed by discharging the treatment liquid in a heated state from the nozzle to evaporate a part of the diluting solution, and recovering the discharged treatment liquid to the main tank.

According to the exemplary embodiment, the chemical liquid may contain hydrogen peroxide, and the diluting solution may contain water.

According to the exemplary embodiment, the treatment of the substrate may be a treatment of removing a foreign material or a thin film containing a metal from the substrate with the treatment liquid.

According to the exemplary embodiment, the metal may include titanium.

According to the exemplary embodiment, the concentration adjustment operation may be performed when a concentration of the chemical liquid in the treatment liquid stored in the main tank is measured, and the measured concentration of the chemical liquid is lower than a set concentration.

According to the exemplary embodiment, the concentration adjustment operation may be performed at predetermined time intervals in the standby time period.

According to the exemplary embodiment, the treatment of the substrate may be performed by supplying the treatment liquid from the nozzle to the substrate supported by a support unit in a cup, and in the concentration adjustment operation, the treatment liquid may be discharged into the cup.

According to the exemplary embodiment, in the standby time period, the nozzle may be located in a home port, and in the concentration adjustment operation, the treatment liquid may be discharged from the nozzle to the home port.

According to the exemplary embodiment, in the standby time period, the nozzle may be located in a home port, and the method may further include an auto-dispensing operation of discharging a treatment liquid from the nozzle into the home port at set time intervals during the standby time period, and the amount of treatment liquid discharged from the nozzle in the concentration adjustment operation may be greater than the amount of treatment liquid discharged from the nozzle in the auto-dispensing operation.

Another exemplary embodiment of the present invention provides a method of treating a substrate, the method including: performing a treatment of removing a foreign material or a thin film from a substrate by supplying a treatment liquid stored in a main tank to the substrate directly or via another tank; and recovering the treatment liquid used in the treatment of the substrate to the main tank directly or via still another tank and then reusing the recovered treatment liquid, in which the treatment liquid contains hydrogen peroxide and water, the foreign material or thin film contains a metal, a concentration adjustment operation of adjusting a concentration of the treatment liquid in the main tank is performed in a standby time period in which the substrate is not treated with the treatment liquid, and in the concentration adjustment operation, the treatment liquid in a heated state is discharged from the nozzle, the discharged treatment liquid is recovered to the main tank, and the concentration of the hydrogen peroxide is increased by evaporation of water from the treatment liquid while the treatment liquid is discharged from the nozzle.

According to the exemplary embodiment, the treatment of the substrate may be performed by supplying the treatment liquid from the nozzle to the substrate supported by a support unit in a cup, and in the concentration adjustment operation, the treatment liquid may be discharged into the cup.

According to the exemplary embodiment, in the concentration adjustment operation, the treatment liquid may be supplied to an upper surface of the support unit or an upper surface of a dummy wafer in a state in which the substrate is not provided into the cup or the dummy wafer is provided to the support unit.

According to the exemplary embodiment, in the standby time period, the nozzle may be located in a home port, and in the concentration adjustment operation, the treatment liquid may be supplied from the nozzle to the home port.

According to the exemplary embodiment, in the standby time period, the nozzle may be located in a home port, and the method may further include an auto-dispensing operation of discharging a treatment liquid from the nozzle to the home port at set time intervals during the standby time period, and the amount of treatment liquid discharged from the nozzle in the concentration adjustment operation may be greater than the amount of treatment liquid discharged from the nozzle in the auto-dispensing operation.

According to the exemplary embodiment, the metal may include titanium.

According to the exemplary embodiment, the concentration adjustment operation may be performed when a concentration of the chemical liquid in the treatment liquid stored in the main tank is measured, and the measured concentration of the chemical liquid is lower than a set concentration.

Still another exemplary embodiment of the present invention provides an apparatus for treating a substrate, the apparatus including: a treating unit in which a liquid treatment process of treating a substrate by supplying a treatment liquid to the substrate is performed; a liquid supply unit for supplying a treatment liquid to the treating unit; and a controller for controlling the liquid supply unit, in which the liquid supply unit may include: a main tank for storing a treatment liquid; a liquid supply line for supplying the treatment liquid in the main tank to the treating unit directly or via another tank; a recovery line connected to the treating unit and recovering the treatment liquid discharged from the treating unit directly or via still another tank; and a heating member for heating the treatment liquid, the treatment liquid includes a chemical liquid and a diluting solution, the controller controls the liquid supply unit so that a concentration adjustment operation is performed in a standby time period during which the liquid treatment process is not performed for a set time, and in the concentration adjustment operation, the treatment liquid heated by the heating member in the main tank is supplied to the treating unit, and the treatment liquid supplied to the treating unit is recovered to the main tank through the recovery line to adjust a concentration of the chemical liquid in the treatment liquid.

According to the exemplary embodiment, the treating unit may include: a housing; a cup disposed in the housing and having a treatment space therein; a support unit for supporting a substrate in the treatment space; and a nozzle for discharging a treatment liquid to a substrate supported by the support unit, and the controller controls the liquid supply unit and the nozzle so that the treatment liquid is discharged into the treatment space in the concentration adjustment operation.

According to the exemplary embodiment, the treating unit may include: a housing; a cup disposed in the housing and having a treatment space therein; a support unit for supporting a substrate in the treatment space; a nozzle for discharging a treatment liquid to the substrate supported by the support unit; and a home port disposed in the housing and in which the nozzle stands by, and the controller may control the liquid supply unit and the nozzle so that the treatment liquid is discharged to the home port in the concentration adjustment operation.

According to the exemplary embodiment, a circulation line for circulating the treatment liquid therein may be connected to the main tank, the heating member may be installed in the circulation line, the apparatus may further include a densitometer for measuring the concentration of the chemical liquid in the liquid supply unit, and the controller may control the liquid supply unit to perform the concentration adjustment operation when the concentration of the chemical liquid measured by the densitometer is equal to or less than a set concentration.

According to the exemplary embodiment of the present invention, in a process of treating a substrate with a treatment liquid containing hydrogen peroxide, when the treatment liquid used for substrate treatment is reused, the concentration of hydrogen peroxide in the treatment liquid may be maintained within a set concentration range.

The effect of the present invention is not limited to the foregoing effects, and those skilled in the art may clearly understand non-mentioned effects from the present specification and the accompanying drawings.

DETAILED DESCRIPTION

Figure 1:
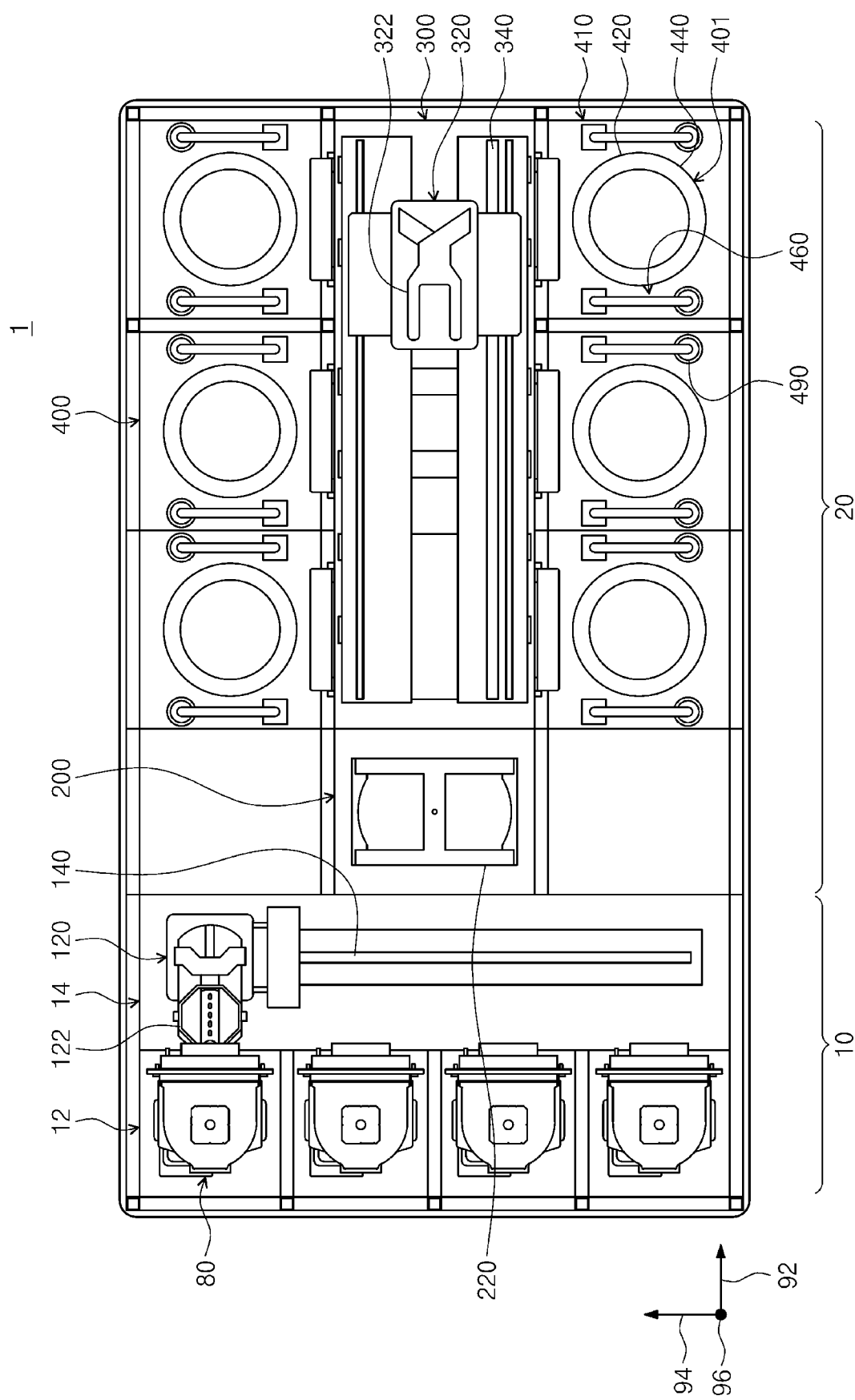
FIG. 1 is a top plan view schematically illustrating a substrate treating apparatus according to an exemplary embodiment of the present invention.

Hereinafter, an exemplary embodiment of the present invention will be described in more detail with reference to the accompanying drawings. The exemplary embodiment of the present invention may be modified in various forms, and the scope of the present invention should not be construed as being limited to the following exemplary embodiments. This exemplary embodiment is provided to more completely explain the present invention to those of ordinary skill in the art. Accordingly, the shapes of elements in the drawings are exaggerated to emphasize clearer description.

FIG. 1 is a top plan view schematically illustrating a substrate treating apparatus according to an exemplary embodiment of the present invention.

Referring to FIG. 1, the substrate treating apparatus includes an index module 10, a treating module 20, and a controller 30. According to the exemplary embodiment, the index module 10 and the treating module 20 are disposed along one direction. Hereinafter, the direction in which the index module 10 and the treating module 20 are disposed is referred to as a first direction 92, and when viewed from above, a direction vertical to the first direction 92 is referred to as a second direction 94, and a direction vertical to both the first direction 92 and the second direction 94 is referred to as a third direction 96.

The index module 10 transfers a substrate W from a container 80 in which the substrate W is accommodated to the treating module 20, and makes the substrate W, which has been completely treated in the treating module 20, be accommodated in the container 80. A longitudinal direction of the index module 10 is provided in the second direction 94. The index module 10 includes a load port 12 and an index frame 14. Based on the index frame 14, the load port 12 is located at a side opposite to the treating module 20. The container 80 in which the substrates W are accommodated is placed on the load port 12. The load port 12 may be provided in plurality, and the plurality of load ports 12 may be disposed in the second direction 94.

As the container 80, an airtight container, such as a Front Open Unified Pod (FOUP), may be used. The container 80 may be placed on the load port 12 by a transport means (not illustrated), such as an overhead transfer, an overhead conveyor, or an automatic guided vehicle, or an operator.

An index robot 120 is provided to the index frame 14. A guide rail 140 of which a longitudinal is the second direction 94 is provided within the index frame 14, and the index robot 120 may be provided to be movable on the guide rail 140. The index robot 120 includes a hand 122 on which the substrate W is placed, and the hand 122 may be provided to be movable forward and backward, rotatable based on the third direction 96 as an axis, and movable in the third direction 96. A plurality of hands 322 are provided to be spaced apart in the vertical direction, and the hands 322 may move forward and backward independently of each other.

The treatment module 20 includes a buffer unit 200, a transfer chamber 300, and a liquid treating chamber 400. The buffer unit 200 provides a space in which the substrate W loaded to the treating module 20 and the substrate W unloaded from the treating module 20 stay temporarily. The liquid treating chamber 400 performs a treatment process of liquid-treating the substrate W by supplying a liquid onto the substrate W. The transfer chamber 300 transfers the substrate W between the buffer unit 200 and the liquid treating chamber 400.

The transfer chamber 300 may be provided so that a longitudinal direction is the first direction 92. The buffer unit 200 may be disposed between the index module 10 and the transfer chamber 300. A plurality of liquid treating chambers 400 is provided and may be disposed on the side of the transfer chamber 300. The liquid treating chamber 400 and the transfer chamber 300 may be disposed in the second direction 94. The buffer unit 220 may be located at one end of the transfer chamber 300.

According to the example, the liquid treating chambers 400 are respectively disposed on both sides of the transfer chamber 300. At each of both sides of the transfer device 300, the liquid treating devices 400 may be provided in an array of A×B (each of A and B is 1 or a natural number larger than 1) in the first direction 92 and the third direction 96.

The transfer chamber 300 includes a transfer robot 320. A guide rail 340 having a longitudinal direction in the first direction 92 is provided in the transfer chamber 300, and the transfer robot 320 may be provided to be movable on the guide rail 340. The transfer robot 320 includes a hand 322 on which the substrate W is placed, and the hand 322 may be provided to be movable forward and backward, rotatable based on the third direction 96 as an axis, and movable in the third direction 96. A plurality of hands 322 are provided to be spaced apart in the vertical direction, and the hands 322 may move forward and backward independently of each other.

The buffer unit 200 includes a plurality of buffers 220 on which the substrate W is placed. The buffers 220 may be disposed while being spaced apart from each other in the third direction 96. A front face and a rear face of the buffer unit 200 are opened. The front face is a face facing the index module 10, and the rear face is a face facing the transfer chamber 300. The index robot 120 may approach the buffer unit 200 through the front face, and the transfer robot 320 may approach the buffer unit 200 through the rear face.

Figure 2:
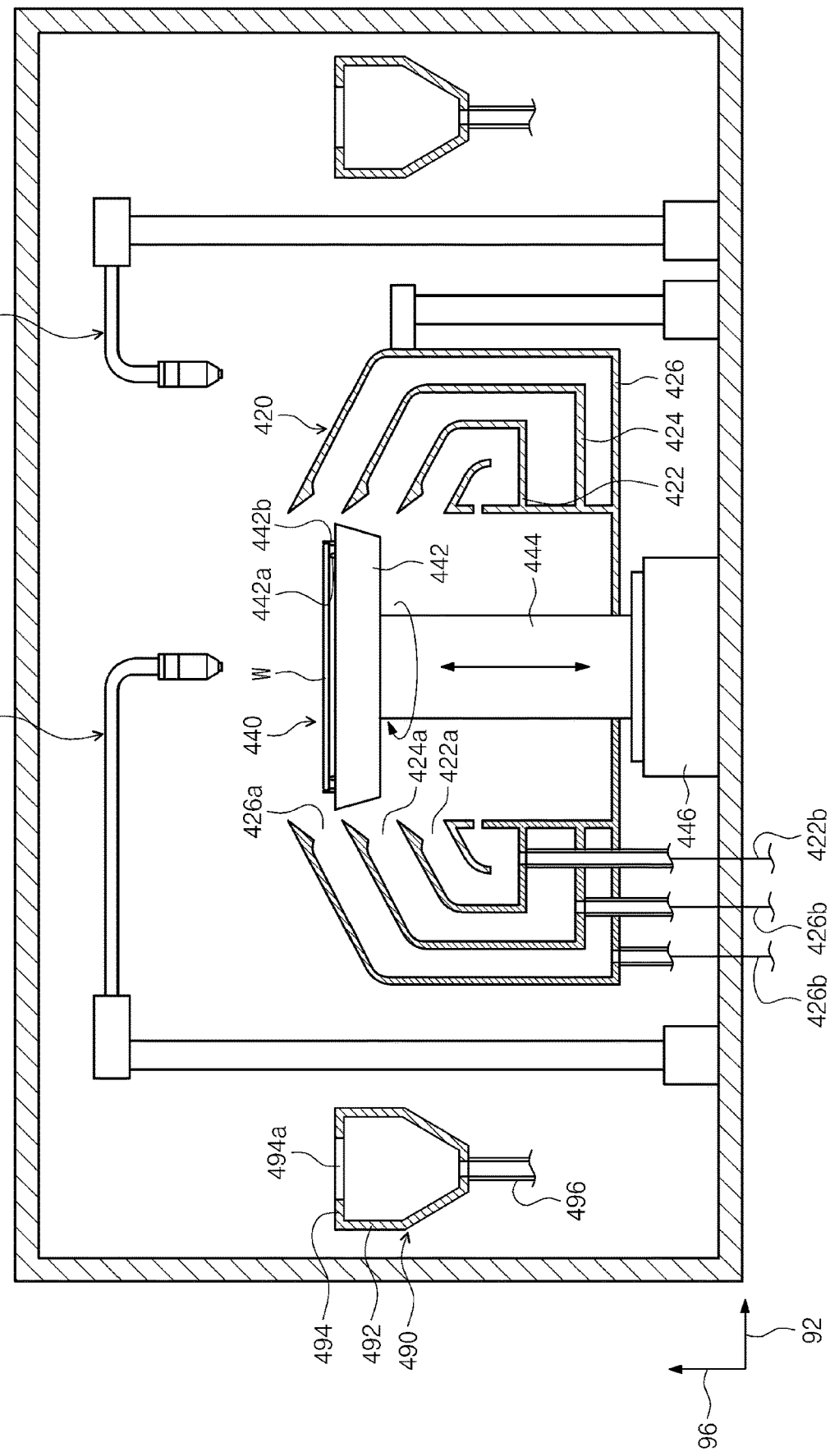
FIG. 2 is a diagram schematically illustrating an exemplary embodiment of a liquid treating chamber of FIG. 1.

FIG. 2 is a diagram schematically illustrating an exemplary embodiment of a liquid treating chamber of FIG. 1. Referring to FIG. 2, the liquid treating chamber 400 includes a treating unit 401. The treating unit 401 includes a housing 410, a cup 420, a support unit 440, a nozzle unit 460, a lifting unit 480, and a home port 490.

The housing 410 is provided in a generally rectangular parallelepiped shape. The cup 420, the nozzle unit 460, and the home port 490 are disposed within housing 410.

The cup 420 has a treatment space with an open top, and the substrate W is liquid-treated in the treatment space. The support unit 440 supports the substrate W in the treating space. The liquid supply unit 460 supplies the liquid onto the substrate W supported by the support unit 440. The liquid may be provided in a plurality of types, and may be sequentially supplied onto the substrate W. The lifting unit 480 adjusts a relative height between the cup 420 and the support unit 440.

According to one example, the cup 420 includes a plurality of recovery containers 422, 424, and 426. Each of the recovery containers 422, 424, and 426 has a recovery space for recovering the liquid that has been used in the substrate treatment. Each of the recovery containers 422, 424, and 426 is provided in a ring shape surrounding the support unit 440. When the liquid treatment process is in progress, the treatment liquid scattered by the rotation of the substrate W may be introduced into the recovery space through inlets 422a, 424a, and 426a of the respective recovery containers 422, 424, and 426 to be described later. According to one example, the cup 420 includes the first recovery container 422, the second recovery container 424, and the third recovery container 426. The first recovery container 422 is disposed to surround the support unit 440, the second recovery container 424 is disposed to surround the first recovery container 422, and the third recovery container 426 is disposed to surround the second recovery container 424. The second inlet 424a through which the liquid is introduced to the second recovery container 424 may be located above the first inlet 422a through which the liquid is introduced to the first recovery container 422, and the third inlet 426a through which the liquid is introduced to the third recovery container 426 may be located above the second inlet 424a. Liquid discharge pipes 422b, 424b, and 426b are coupled to the recovery containers 422, 424, and 426, respectively.

The support unit 440 includes a support plate 442 and a driving shaft 444. An upper surface of the support plate 442 may be provided in a generally circular shape, and may have a diameter larger than a diameter of the substrate W. A support pin 442a is provided at the center of the support plate 442 to support the rear surface of the substrate W, and the upper end of the support pin 442a is provided to protrude from the support plate 442 so that the substrate W is spaced apart from the support plate 442 by a predetermined distance. A chuck pin 442b is provided to an edge of the support plate 442. The chuck pin 442b is provided to protrude upward from the support plate 442, and supports the lateral portion of the substrate W so that the substrate W is not separated from the support unit 440 when the substrate W is rotated. The driving shaft 444 is driven by the driver 446, is connected to the center of the bottom surface of the substrate W, and rotates the support plate 442 based on the central axis thereof.

The nozzle unit 460 includes a first nozzle 462 and a second nozzle 464. The first nozzle 462 supplies the treatment liquid onto the substrate W. According to the example, a titanium nitride film is formed on the upper surface of the substrate, and the treatment liquid may remove the titanium nitride film from the upper surface of the substrate. The treatment liquid may be provided to the substrate at a temperature higher than room temperature. The treatment liquid includes a chemical liquid and a diluting solution. According to one example, the chemical liquid may be hydrogen peroxide and the diluting solution may be water. Optionally, the treatment liquid may further contain additives other than hydrogen peroxide and water. For example, the additives may include a corrosion inhibitor. The second nozzle 464 supplies water onto the substrate W. The water may be pure water or deionized water.

The first nozzle 462 and the second nozzle 464 are supported by arms different from each other, and the arms may move independently. Optionally, the first nozzle 462 and the second nozzle 464 may be mounted on the same arm and moved at the same time.

The liquid supply unit may further include one or a plurality of nozzles in addition to the first nozzle 462 and the second nozzle 464. Additional nozzles may supply different types of treatment liquids to the substrate. For example, the other type of treatment liquid may be an acid solution or a base solution for removing foreign substances on the substrate. In addition, another type of treatment liquid may be alcohol having surface tension lower than that of water. For example, the alcohol may be isopropyl alcohol.

The lifting unit 480 moves the cup 420 in the vertical direction. By the vertical movement of the cup 420, a relative height between the cup 420 and the substrate W is changed. Accordingly, since the recovery containers 422, 424, and 426 for recovering the treatment liquid are changed according to the type of the liquid supplied to the substrate W, the liquids may be separated and collected. Unlike the description, the cup 420 may be fixedly installed, and the lifting unit 480 may move the support unit 440 in the vertical direction.

The home port 490 is disposed within the housing 410. The home port 490 is disposed on one side of cup 420. The home port 490 includes a body 492 in which an inner space is formed with an open top. A discharge pipe 496 is coupled to the lower surface of the inner space. The home port 490 may include a cover 494 covering an upper portion of the inner space. An opening 494a into which the treatment liquid discharged from the first nozzles 462 flows may be formed in the cover 494. Optionally, without provision of a cover, the upper portion of the inner space may be open to the atmosphere.

While the liquid treatment is not performed on the substrate, the first nozzles 462 stands by in the home port 490. The first nozzle 462 may perform auto-dispense and pre-dispense operations in the home port 490. The auto-dispensing is an operation in which the treatment liquid is injected into the home port 490 so that the treatment liquid does not solidify in the first nozzle 462 while the first nozzle 462 waits in the home port 490 for a long time without discharging the liquid to the substrate. The auto-dispensing may be repeated at regular time intervals. The free dispensing is an operation in which the first nozzle 462 injects the treatment liquid into the home port 490 so that the treatment liquid may be stably discharged immediately before the liquid treatment is performed on the substrate after the first nozzle 462 waits in the home port 490 for a long time.

The liquid supply unit 500 supplies the treatment liquid to the nozzle 462. Hereinafter, the present invention will be descried based on the case where the treatment liquid is an aqueous hydrogen peroxide solution as an example. Hereinafter, the first nozzle 462 is described as a nozzle 462.

Figure 3:
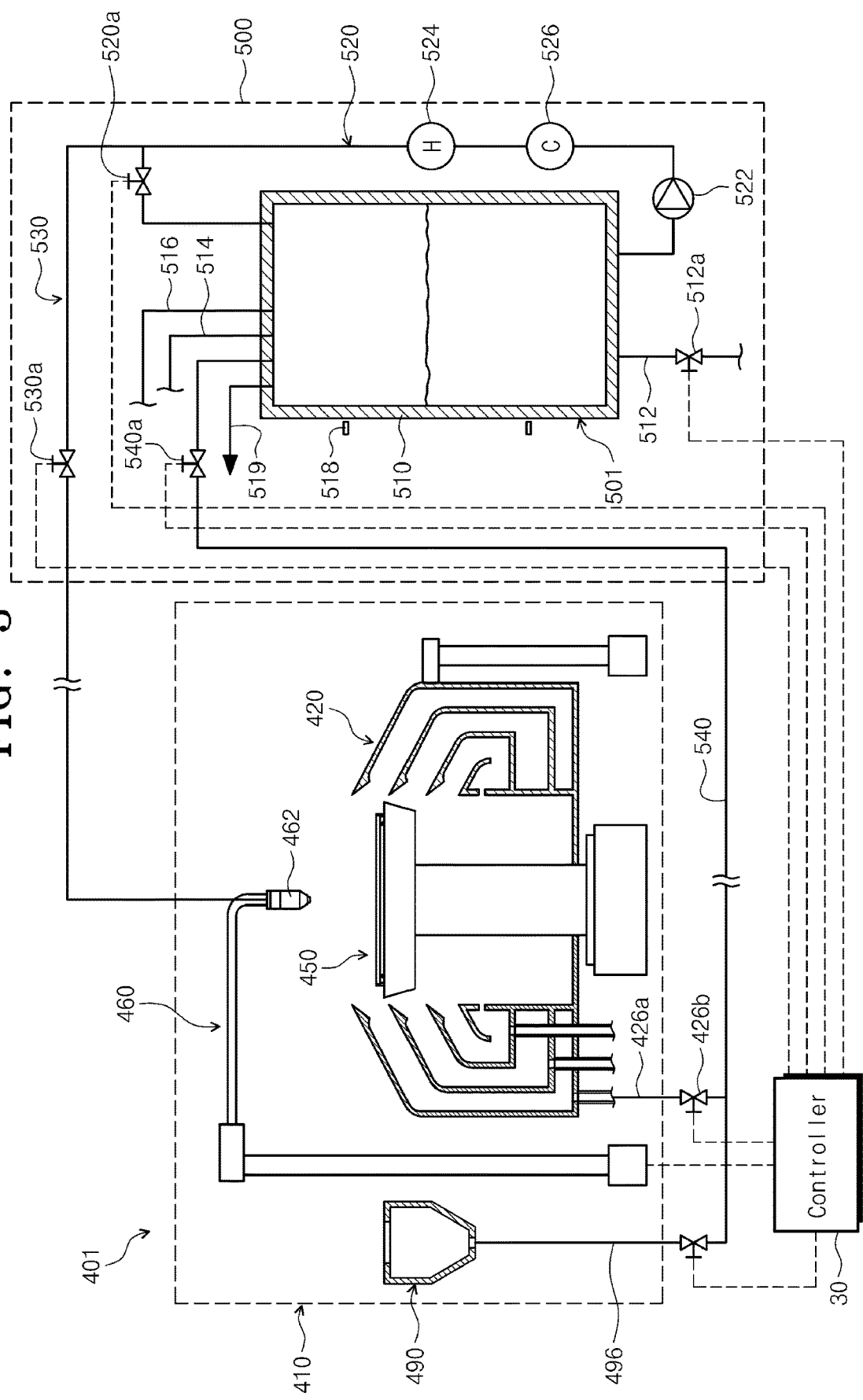
FIG. 3 is a diagram schematically illustrating an example of a liquid supply unit according to the exemplary embodiment of the present invention.

FIG. 3 is a diagram schematically illustrating an example of the liquid supply unit 500. Referring to FIG. 3, the liquid supply unit 500 includes a main tank 501. The main tank 501 supplies the treatment liquid to the nozzle 462. The home port 490 and the main tank 501, and the treating unit 401 and the main tank 501 are connected to each other by a recovery line 540.

The main tank 501 includes a housing 510 and a circulation line 520. The housing 510 is provided in a rectangular parallelepiped or cylindrical shape. The housing 510 has a space in which the treatment liquid is stored. The space within the housing 510 may be sealed against the outside.

A liquid supply line 530 is coupled to the housing 510. The main tank 501 is connected to the nozzle 462 through a liquid supply line 530. A valve 530a is installed in the liquid supply line 530. The treatment liquid is supplied to the nozzle 462 through the liquid supply line 530. The liquid supply line 530 may be coupled to the housing 510 through an upper wall of the housing 510. A recovery line 540 is connected to the housing 510. The recovery line 540 may be coupled with the discharge pipe 496 connected to the home port 490 or one 426b of the liquid discharge pipes connected to the treating unit 401. The treatment liquid discharged from the home port 490 or the treating unit 401 through the recovery line 540 is recovered into the housing 510. A waste liquid line 512 is connected to the housing 510. A valve 512a is installed in the waste liquid line 512. The treatment liquid in the housing 510 may be discharged to the outside through the waste liquid line 512 and be discarded.

A hydrogen peroxide supplement line 514 and a water supplement line 516 may be connected to the housing 510. Valves (not illustrated) are installed on the hydrogen peroxide supplement line 514 and the water supplement line 516, respectively. The hydrogen peroxide supplement line 514 may supplement hydrogen peroxide to the treatment liquid flowing into the housing 510, and the water supplement line 516 may supplement water to the treatment liquid introduced into the housing 510. The supplement of hydrogen peroxide and water may be performed based on the water level of the treatment liquid measured by a water level measuring sensor 518 provided in the housing 510. Optionally, after the treatment liquid is reused a predetermined number of times or for a predetermined period of time and the treatment liquid is discharged from the housing 510, hydrogen peroxide and water may be supplemented. When the treatment liquid contains additives, an additive supplement line (not illustrated) may be additionally connected to the housing 510.

A vent line 519 is connected to the housing 510. The vent line 519 exhausts water vapor evaporated from the treatment liquid stored in the housing 510 to the outside of the housing 510. The vent line 519 is coupled to the upper surface of the housing 510. The vent line 519 may be provided with a smaller diameter than the other lines. When the inside of the housing 510 reaches a predetermined pressure or higher, water vapor in the housing 510 may be discharged through the vent line 519.

The circulation line 520 is connected to the housing 510. According to one example, one end of the circulation line 520 functions as an inlet and is coupled to a bottom surface of the housing 510. The other end of the circulation line 520 functions as an outlet and is immersed in the treatment liquid in the housing 510. Optionally, the other end of the circulation line 520 may be positioned higher than the water level of the treatment liquid stored in the housing 510.

A pump 522 and a heating member 524 are installed in the circulation line 520. The pump 522 provides fluid pressure to allow the treatment liquid in the housing 510 to flow in the circulation line 520. The heating element includes a heater 524. The heater 524 heats the treatment liquid flowing through the circulation line 520. According to one example, the heater 524 is controlled to heat the treatment liquid to a set temperature. The set temperature may be about 40° C. to 90° C.

The liquid supply unit 500 has a concentration measuring member. The concentration measuring member measures the concentration of hydrogen peroxide in the treatment liquid stored in the housing 510. According to one example, the concentration measuring member has a densitometer 526. The densitometer 526 may be installed on the circulation line 520. The densitometer 526 may directly measure the concentration of hydrogen peroxide in the treatment liquid flowing through the circulation line 520. Optionally, the concentration measuring member may measure a value other than the concentration of hydrogen peroxide in the treatment liquid and calculate the concentration of hydrogen peroxide based on the measured value. Optionally, the densitometer 526 may be installed in a location other than the circulation line 520 to measure the concentration of hydrogen peroxide in the treatment liquid stored in the housing 510.

The controller 30 controls the operation of the nozzle 462 and the open/close state of each of the valves 512a, 520a, 530a, and 540a provided in the liquid supply unit 500. The nozzle 462 moves between a process position and a standby position. The process position is an area where the treating unit 401 is provided, and the standby position is an area where the home port 490 is provided. When the treatment is performed on the substrate W, the nozzle 462 moves to the process position and discharges the treatment liquid to the substrate W. While no liquid treatment is performed on the substrate W, the nozzle 462 moves to the standby position.

Figure 4:
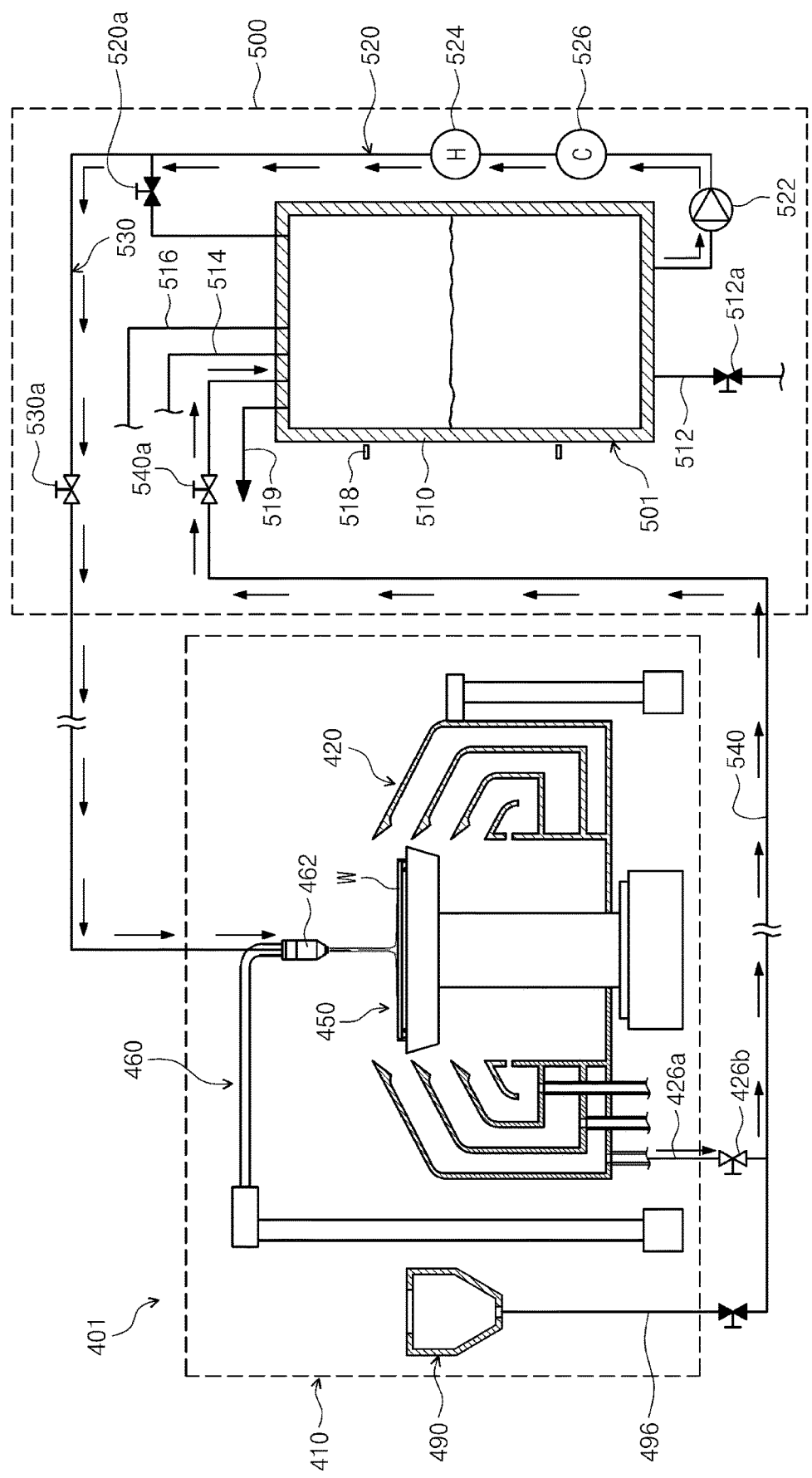
FIGS. 4 and 5 are diagrams schematically illustrating a location of a nozzle and a flow path of a treatment liquid in a treatment mode and a standby mode, respectively.
Figure 5:
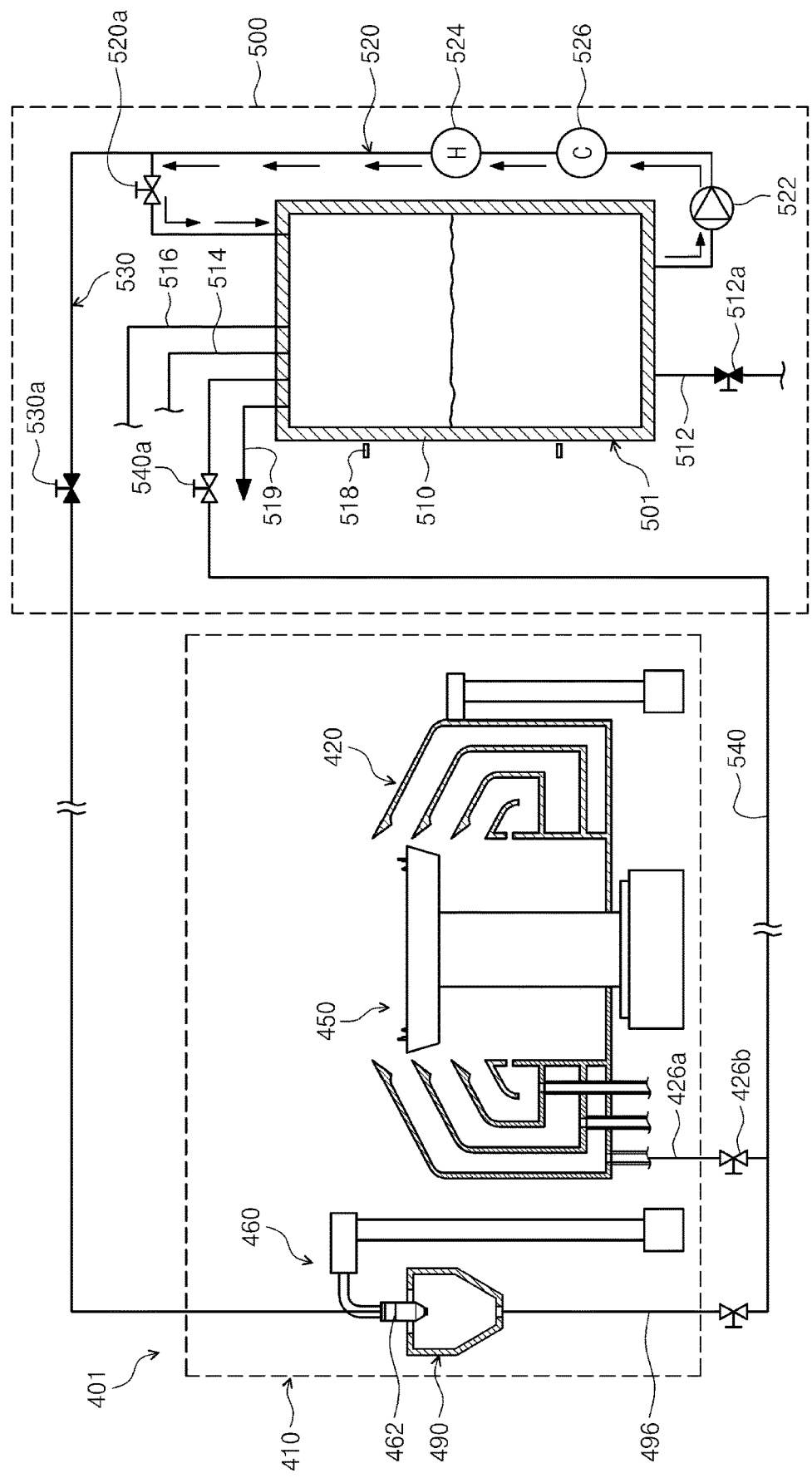
Figure 6:
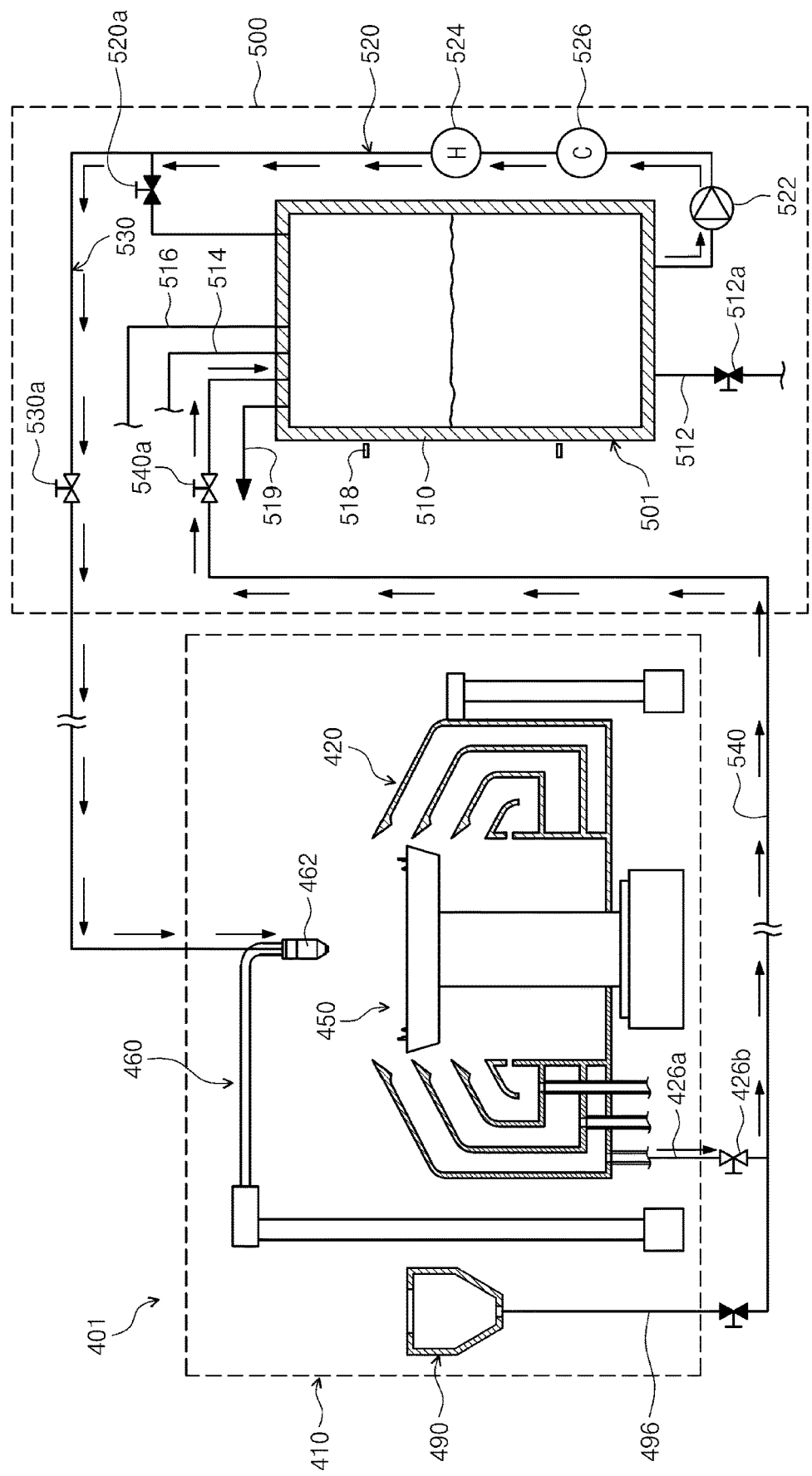
FIG. 6 is a diagram illustrating an example of a location of a nozzle and a flow path of a treatment liquid when a concentration adjustment operation is performed in a standby mode.

The controller 30 causes the treatment mode and the standby mode to be performed. FIGS. 4 and 5 are diagrams schematically illustrating a location of a nozzle and a flow path of the treatment liquid in the treatment mode and the standby mode, respectively. Further, FIG. 6 is a diagram illustrating an example of a location of a nozzle and a flow path of the treatment liquid when a concentration adjustment operation is performed in the standby mode. In FIGS. 4 to 6, valves with a filled inside represent a closed state, and valves with an empty inside represent an open state. Also, an arrow indicated by a solid line indicates a flow direction of the treatment liquid.

Referring to FIG. 4, when the substrate W is loaded into the treating unit 401, the treatment mode is performed. During the treatment mode, the nozzle 462 continuously supplies the treatment liquid to the substrates W belonging to the same group.

When the treatment is performed on the substrate W, generally a plurality of substrates W belonging to one group is continuously treated in general. The substrates W accommodated in the same container 80 may be provided as a group. Optionally, the substrates W accommodated in the plurality of containers 80 may be provided as a group. The plurality of substrates W belonging to the same group is sequentially loaded into the treating unit 401 one by one, and the treatment liquid is discharged from the nozzle 462 onto the loaded substrates W. When the treatment of the loaded substrate W is completed, the substrate W is unloaded from the treating unit 401. The treatment of the substrate W may include other treatments in addition to the treatment using the treatment liquid. For example, the treatment of the substrate W may include a subsequent treatment with a different type of liquid other than the treatment liquid or a drying treatment. Thereafter, the next substrate W among the substrates belonging to the same group is loaded into the treating unit 401, and the same treatment is performed. While the continuous treatment is performed on the substrates W belonging to one group, the nozzle 462 continuously reciprocates between the standby position and the process position.

When the treatment is completed for the plurality of substrates W belonging to one group, the standby mode is performed. Referring to FIG. 5, the nozzle 462 moves to the standby position and waits at the home port 490 until the treatment begins for the plurality of substrates W belonging to the next group. During the standby mode, the treatment liquid continuously circulates through the circulation line 520, and the treatment liquid is continuously heated by the heater 524 so that the treatment liquid maintains a set temperature.

The treatment of the substrate W in the above-described treatment mode may be the treatment of removing the titanium nitride thin film formed on the substrate W or removing the titanium nitride-containing material remaining on the substrate W by using the treatment liquid containing hydrogen peroxide. In this case, the treatment liquid used to treat the substrate W during the treatment mode is recovered to the main tank 501, and waits in a temperature-adjusted state until the next treatment mode is performed. Titanium or a titanium-containing material separated from the substrate W remains in the treatment liquid. Titanium reacts with hydrogen peroxide to decompose hydrogen peroxide. Therefore, as the standby mode becomes longer, the concentration of hydrogen peroxide in the treatment liquid gradually decreases.

According to the exemplary embodiment, the concentration adjustment operation is performed during standby mode. Referring to FIG. 6, in the concentration adjustment operation, the treatment liquid is discharged from the nozzle 462 and the discharged treatment liquid is returned to the main tank 501 again. According to the example, in the concentration adjustment operation, the nozzle 462 discharges the treatment liquid to the treating unit 401. In this case, the treating unit 401 may be in the state where the substrate W is not loaded. The inside of the treating unit 401 may be at atmospheric pressure or at a pressure slightly higher than atmospheric pressure. When the treatment liquid is discharged from the nozzle 462 within the treating unit 401, the pressure of the treatment liquid before and after the discharge is greatly reduced. Since the treatment liquid is discharged from the nozzle 462 while being heated by the heater 524, a large amount of water is evaporated from the treatment liquid during the discharge. The treatment liquid discharged to the treating unit 401 is returned to the main tank 501 again. The concentration of hydrogen peroxide in the recovered treatment liquid increases due to the evaporation of water. The above-described process is performed once or a plurality of times until the concentration of hydrogen peroxide in the treatment liquid in the main tank 501 reaches a set concentration.

The concentration adjustment operation may be performed when the densitometer 526 detects that the concentration of hydrogen peroxide is equal to or less than a set value. Optionally, the concentration adjustment operation may be performed when a preset standby time elapses in the standby mode.

In the concentration adjustment operation, the nozzle 462 may supply the treatment liquid to the upper surface of the support plate 442. In order to remove hydrogen peroxide remaining on the support plate 442 and the inner wall of the cup 420, the nozzle 462 unit may supply a rinsing liquid to the rotating support plate 442. According to one example, water and an organic solvent may be sequentially supplied to the rotating support plate 442 as the rinsing liquid. Used water and organic solvents may be drained to the outside without recovery. In the concentration adjustment operation, the support plate 442 may be fixed or rotated.

Figure 7:
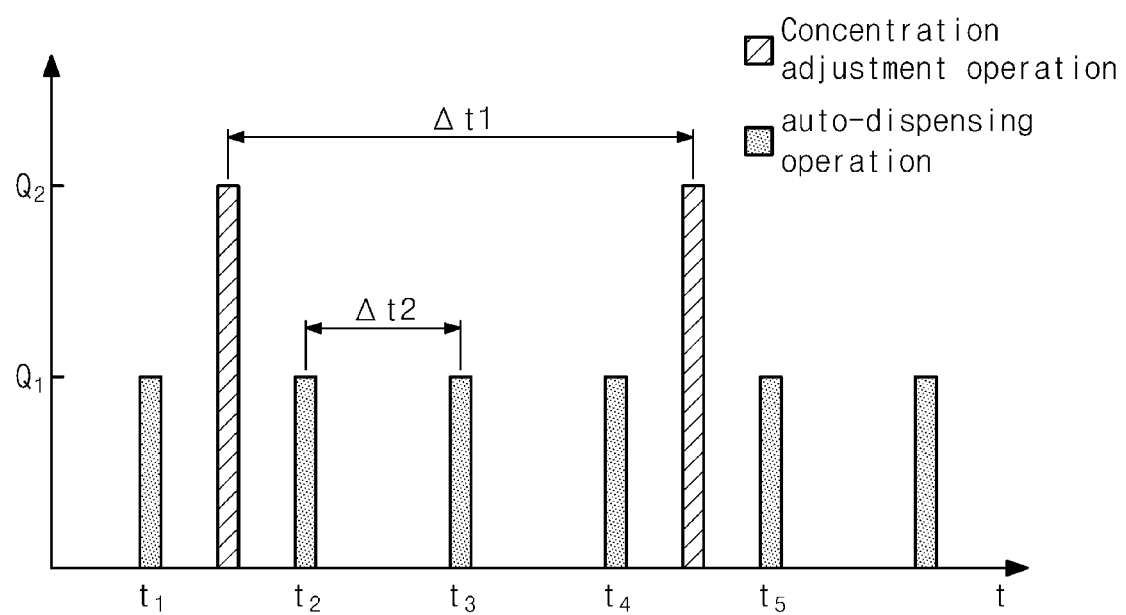
FIG. 7 is a graph illustrating the amount of treatment liquid discharged in an auto-dispensing operation and a concentration adjustment operation.

In the present exemplary embodiment, the concentration adjustment operation is distinguished from the auto-dispensing operation. FIG. 7 is a graph illustrating an example of the amount of treatment liquid discharged in the auto-dispensing operation and the concentration adjustment operation. Referring to FIG. 7, in once concentration adjustment operation, the nozzle 462 discharges the treatment liquid at a first flow rate Q1, and in once auto-dispensing operation, the nozzle 462 discharges the treatment liquid at a second flow rate Q2. In this case, the first flow rate Q1 is greater than the second flow rate Q2. In the concentration adjustment operation, the discharge flow rate per unit time discharged from the nozzle 462 may be greater than the discharge flow rate per unit time discharged from the nozzle 462 in the auto-dispensing operation. Optionally, the discharge flow rates per unit time discharged from the nozzle 462 in the concentration adjustment operation and the auto-dispensing operation may be equal to each other, and the discharge time from the nozzle 462 in the concentration adjustment operation may be longer than the discharge time per unit time discharged from the nozzle 462 in the auto-dispensing operation. The auto-dispensing may prevent the treatment liquid from being hardened in the nozzle 462 even when a relatively small amount is discharged. However, in the case of the concentration adjustment operation, the nozzle 462 discharges a relatively large amount of treatment liquid so that a large amount of water may be evaporated during the discharge.

In addition, when the discharge of the treatment liquid is performed based on the set time in the concentration adjustment operation, the set time for the discharge in the concentration adjustment operation is a first interval ($\Delta t1$), and the set time for the discharge in the auto-dispensing operation is a second interval ($\Delta t2$). In this case, the first interval $\Delta t1$ is greater than the second interval $\Delta t2$.

Figure 8:
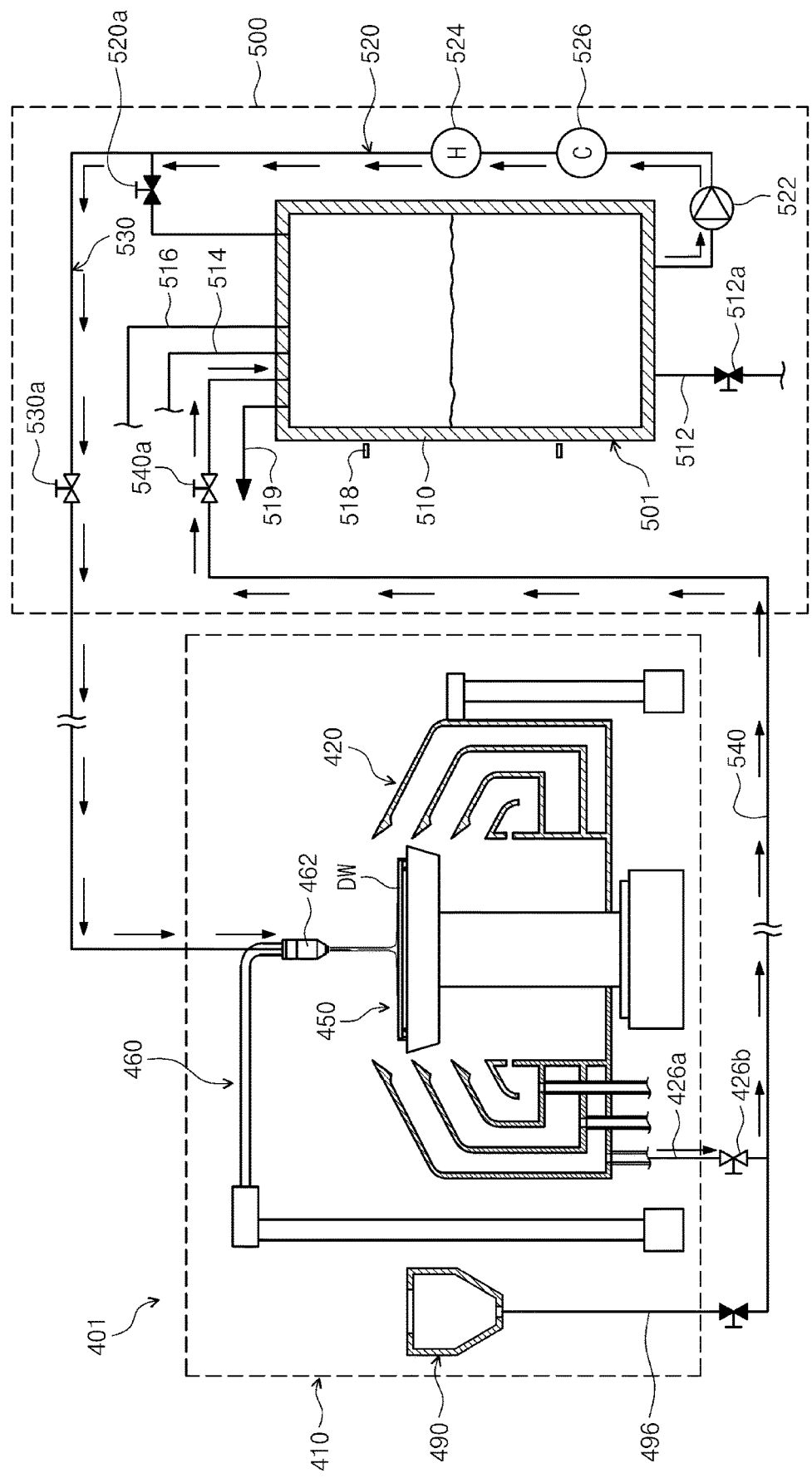
FIG. 8 is a diagram illustrating another example of the exemplary embodiment of FIG. 6.

In FIG. 6, it has been described that when the treatment liquid is discharged from the nozzle 462 to the treating unit in the concentration adjustment operation, the substrate is removed from the treating unit and the treatment liquid is directly discharged onto the support plate 442. However, unlike this, as illustrated in FIG. 8, a dummy wafer DW is placed on the support plate 442 in the treating unit 401, and in a state in which the dummy wafer DW is rotated, the treatment liquid may be discharged from the nozzle 462 onto the dummy wafer DW.

When the concentration adjustment operation is not performed, the dummy wafer DW may be stored in the buffer unit 200. In the buffer unit 200, a space for temporarily storing substrates and a space for storing dummy wafers may be separated. Two dummy wafers DW may be provided. Optionally, one or three or more dummy wafers DW may be provided. The dummy wafer DW may have the same size and shape as those of the substrate. The dummy wafer DW may be transported between the buffer unit 200 and the treating unit 401 by the transport robot 320.

Figure 9:
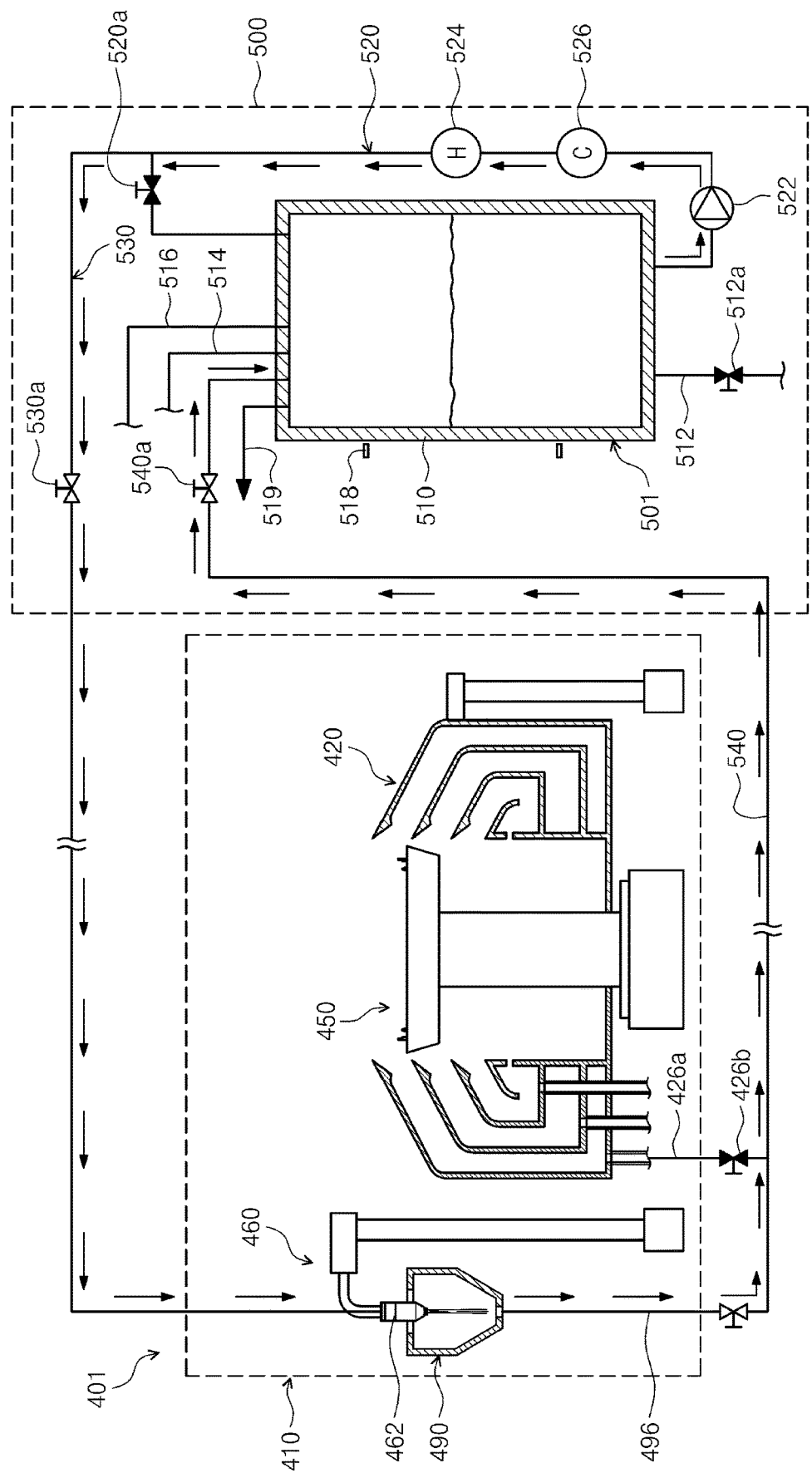
FIG. 9 is a diagram illustrating another example of a location of a nozzle and a flow path of a treatment liquid when the concentration adjustment operation is performed in the standby mode.

In the above example, it has been described that the nozzle 462 discharges the treatment liquid into the treating unit 401 in the concentration adjustment operation in the standby mode. However, unlike this, as illustrated in FIG. 9, in the concentration adjustment operation, the nozzle 462 may discharge the treatment liquid into the home port 490. The treatment liquid discharged into the home port 490 is returned to the main tank 501 again through the recovery line 540.

When the treatment liquid is discharged from the nozzle 462, evaporation of water in the treatment liquid is further accelerated when the space where the treatment liquid is discharged is wide. Generally, the space within the treating unit 401 is wider than the space within the home port 490. Therefore, when the treatment liquid is discharged from the nozzle 462 into the treating unit 401, the amount of water evaporated is greater compared to the case where the treatment liquid is discharged into the home port 490.

Figure 10:
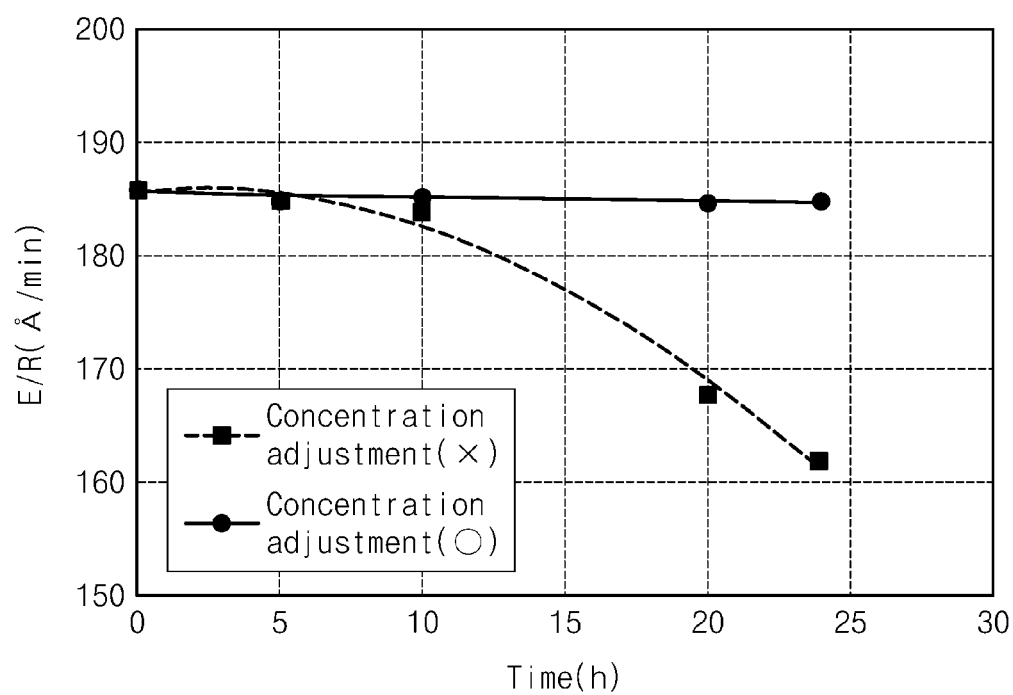
FIG. 10 is a diagram illustrating an etching rate when the substrate is treated in the treatment mode for each of the case where the concentration adjustment operation is performed in the standby mode and the case where the concentration adjustment operation is not performed in the standby mode.

FIG. 10 is a diagram illustrating an etching rate when the substrate is treated in the treatment mode for each of the case where the concentration adjustment operation is performed in the standby mode and the case where the concentration adjustment operation is not performed in the standby mode. The treatment liquid is hydrogen peroxide, and an etch target film is a titanium nitride (TiN) thin film. In the graph, '■' is the etching rate of the TiN thin film when the concentration adjustment by discharging the treatment liquid from the nozzle 462 is not performed in the standby mode, and '●' is the etching rate of the TiN thin film when the concentration is adjusted by discharging the treatment liquid from the nozzle 462 in the standby mode. Except for the performance and non-performance of the concentration adjustment by discharging the treatment liquid from the nozzle 462 in the standby mode, the rest of the conditions were the same.

The etch rate is about 187 Å/min when the standby time is zero in the standby mode. In the case where the concentration adjustment is not performed in the standby mode, when 10 hours elapsed, the etch rate decreased to about 184 Å/min, when 20 hours elapsed, the etch rate decreased to about 168 Å/min, and when 24 hours elapsed, the etch rate decreased to about 162 Å/min. However, when the concentration adjustment is performed in the standby mode, the change in the etching rate is not large.

In the above example, the present invention has been described based on the structure in which the recovery line 540 is directly connected to the main tank 501 as an example.

However, unlike this, the main tank 501 is not directly connected to the recovery line 540, and the main tank 501 may recover the liquid discharged from the treating unit 401 or the home port 490 via the recovery tank 502.

Figure 11:
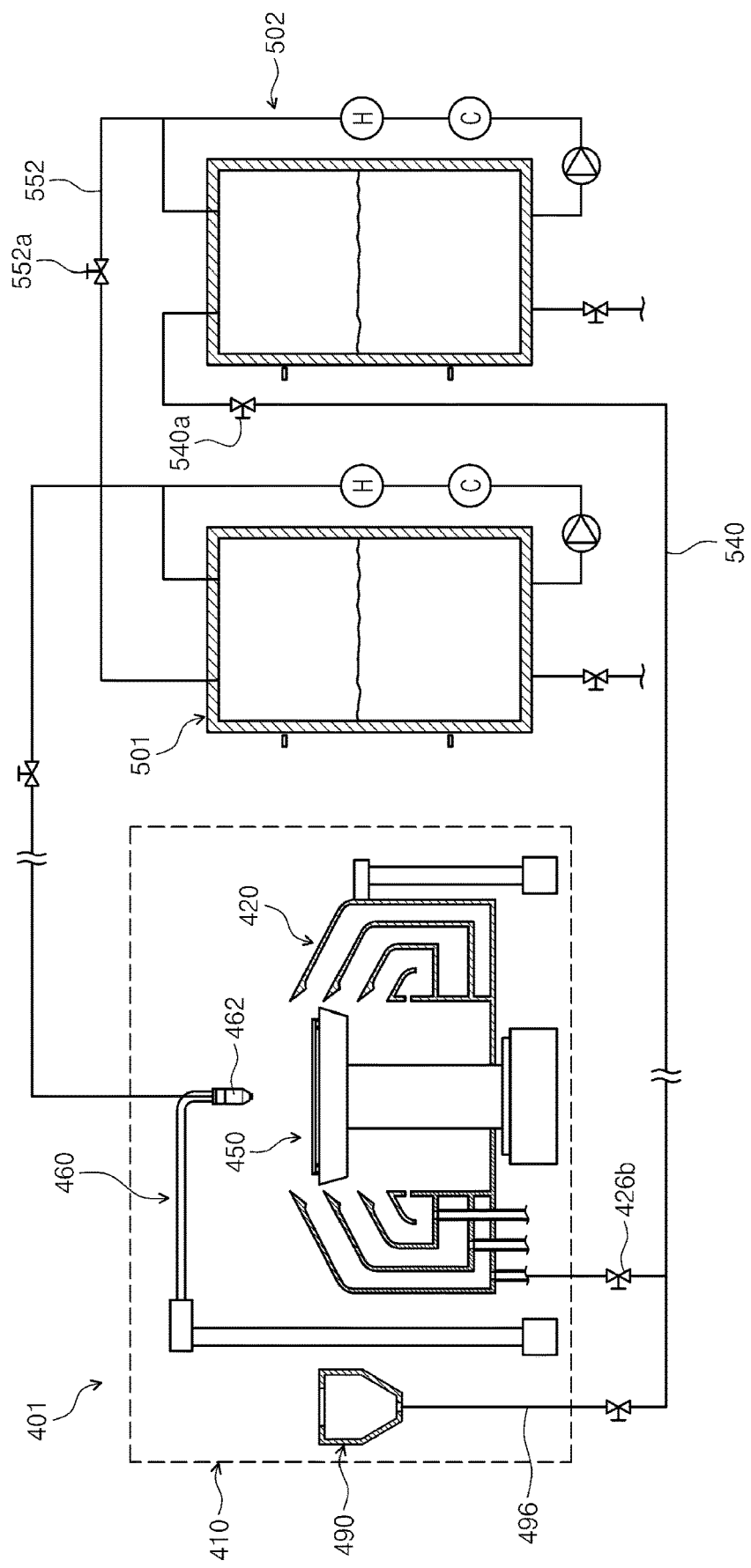
FIGS. 11 to 13 are diagrams schematically illustrating another example of a liquid supply unit, respectively.

FIG. 11 is a diagram schematically illustrating another example of the liquid supply unit. A liquid supply unit 500 includes a main tank 501 and a recovery tank 502. Unlike FIG. 3, the recovery line 540 is coupled to a recovery tank 502, and the main tank 501 and the recovery tank 502 are coupled by a connection line 552. A valve 522a is installed in the connection line 552. The recovery tank 502 may have the same structure as that of the main tank 501. That is, the recovery tank 502 may include a housing, a circulation line, a heater, and a densitometer. The concentration of hydrogen peroxide in the treatment liquid may be measured in the main tank 501 or the recovery tank 502. Optionally, the recovery tank 502 may have only a housing without a circulation line.

In addition, the main tank 501 may supply a liquid to the nozzle 462 via the supply tank 503 without being directly connected to the liquid supply line 530.

Figure 12:
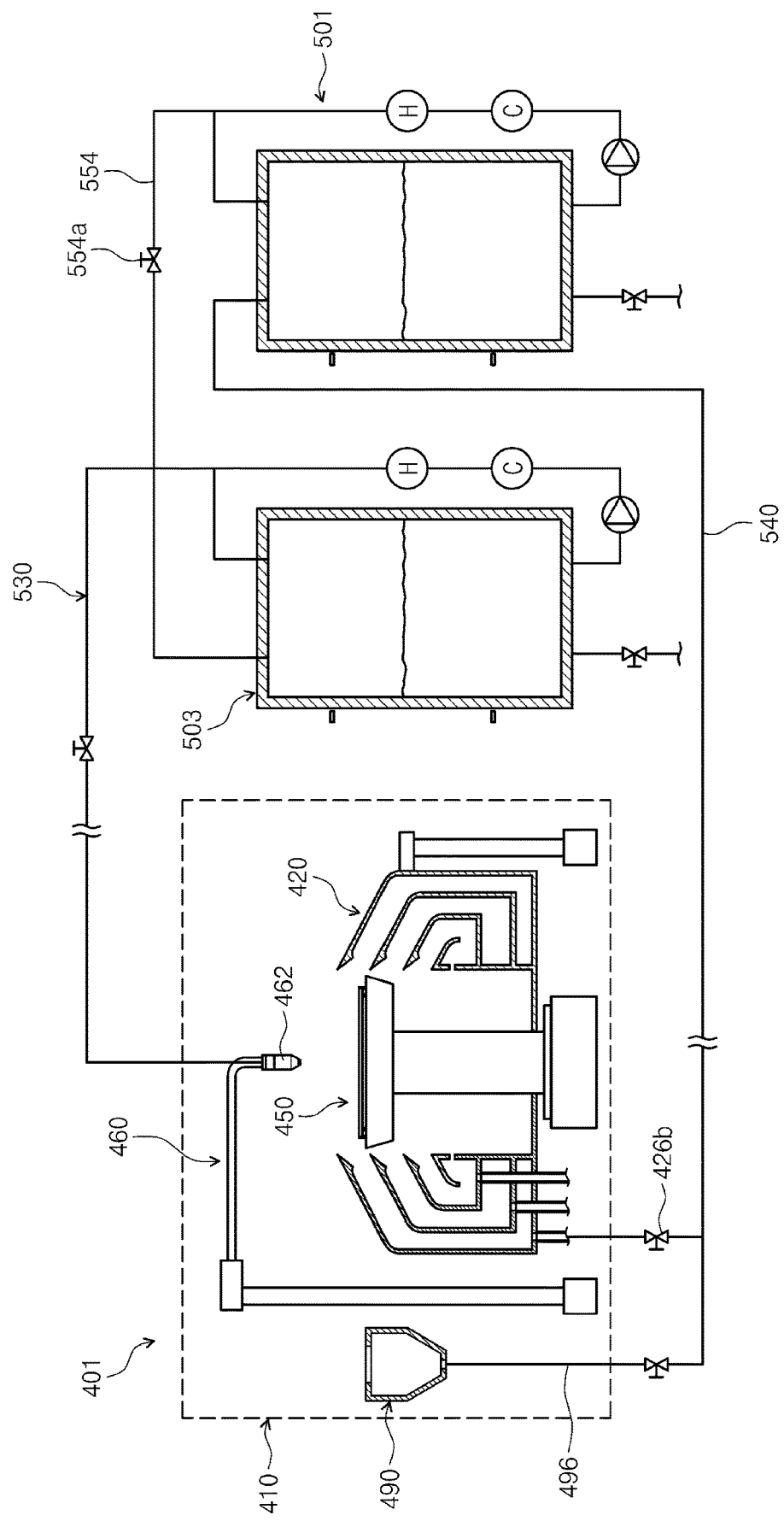

FIG. 12 is a diagram schematically illustrating another example of a liquid supply unit. A liquid supply unit 500 includes a main tank 501 and a supply tank 503. Unlike FIG. 3, the liquid supply line 530 is coupled to the supply tank 503, and the main tank 501 and the supply tank 503 are coupled by a connection line 554. A valve 554a is installed in the connection line 554. The supply tank 503 may have the same structure as that of the main tank 501. That is, the supply tank 503 may have a housing, a circulation line, a heater, and a densitometer. The concentration of hydrogen peroxide in the treatment liquid may be measured in the main tank 501 or the supply tank 503. Optionally, the supply tank 503 may include only a housing without a circulation line.

Figure 13:
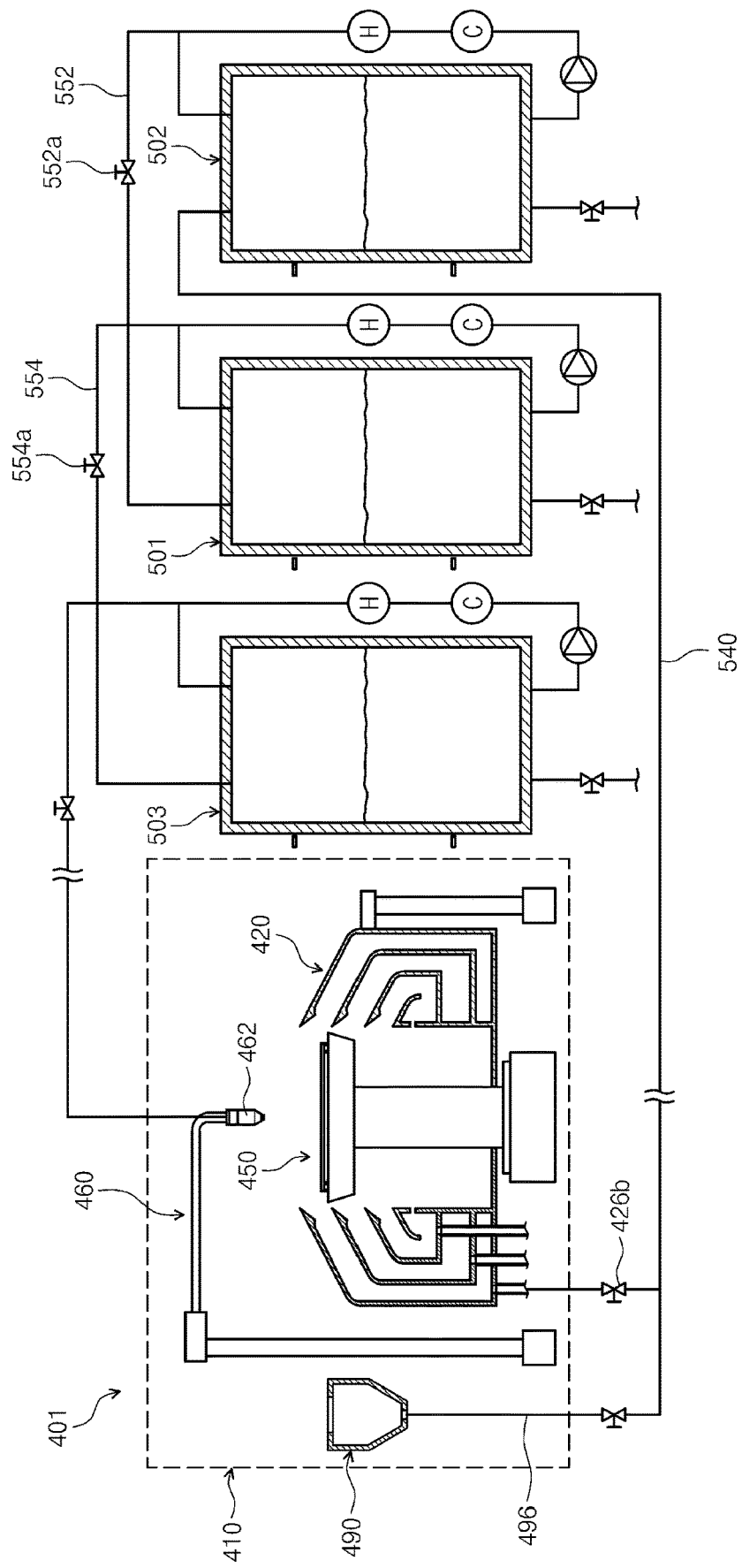

FIG. 13 is a diagram schematically illustrating another example of a liquid supply unit. A liquid supply unit 500 includes a supply tank 503, a main tank 501, and a recovery tank 502. Unlike FIG. 3, a liquid supply line 530 is coupled to the supply tank 503 and the recovery line 540 is coupled to the recovery tank 502. The main tank 501 and the supply tank 503 are coupled by a first connection line 552. The main tank 501 and the recovery tank 502 are coupled by a second connection line 554. The supply tank 503 and the recovery tank 502 may have the same structure as that of the main tank 501. That is, the supply tank 503 and the recovery tank 502 may have housings, circulation lines, heaters, and densitometers. The concentration of hydrogen peroxide in the treatment liquid may be measured in the main tank 501, the supply tank 503, or the recovery tank 502. Optionally, the supply tank 503 and/or the recovery tank 502 may include only housings without circulation lines.

In the above example, it has been described that the target to be removed by the treatment liquid containing hydrogen peroxide is a film containing titanium formed on the substrate or a material containing titanium remaining on the substrate W. However, since hydrogen peroxide is generally well decomposed by metals, the technical spirit of the present invention may be applied even when the target object to be removed by a treatment liquid containing hydrogen peroxide is a metal other than titanium.

In addition, in the above-described example, in the treatment liquid containing a chemical liquid and water, the case where the chemical liquid is hydrogen peroxide has been described as an example. However, the technical spirit of the present invention may also be applied to a treatment liquid including a chemical liquid other than hydrogen peroxide when the concentration of the chemical liquid decreases over time.

In the above example, the present invention has been described based on the case where diluting solution in the treatment liquid is water as an example. Alternatively, however, the diluting solution may be a liquid other than water.

The foregoing detailed description illustrates the present invention. In addition, the above description shows and describes the exemplary embodiments of the present invention, and the present invention may be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. In addition, the appended claims should be construed to include other exemplary embodiments as well.

What is claimed is:

1. A method of treating a substrate, the method comprising:
    treating a substrate by supplying a treatment liquid stored in a main tank from a nozzle in a heated state to the substrate directly or via another tank, and recovering the treatment liquid used in the treatment of the substrate to the main tank directly or via still another tank, and then reusing the recovered treatment liquid,
    wherein the treatment liquid includes a chemical liquid and a diluting solution,
    a concentration adjustment operation of adjusting a concentration of the treatment liquid in the main tank is performed in a standby time period in which the substrate is not treated with the treatment liquid, and
    the concentration adjustment operation is performed by discharging the treatment liquid in a heated state from the nozzle to evaporate a part of the diluting solution, and recovering the discharged treatment liquid to the main tank.

2. The method of claim 1, wherein the chemical liquid contains hydrogen peroxide, and the diluting solution contains water.

3. The method of claim 2, wherein the treatment of the substrate is a treatment of removing a foreign material or a thin film containing a metal from the substrate with the treatment liquid.

4. The method of claim 3, wherein the metal includes titanium.

5. The method of claim 1, wherein the concentration adjustment operation is performed when a concentration of the chemical liquid in the treatment liquid stored in the main tank is measured, and the measured concentration of the chemical liquid is lower than a set concentration.

6. The method of claim 1, wherein the concentration adjustment operation is performed at predetermined time intervals in the standby time period.

7. The method of claim 1, wherein the treatment of the substrate is performed by supplying the treatment liquid from the nozzle to the substrate supported by a support unit in a cup, and
in the concentration adjustment operation, the treatment liquid is discharged into the cup.

8. The method of claim 1, wherein in the standby time period, the nozzle is located in a home port, and
in the concentration adjustment operation, the treatment liquid is discharged from the nozzle to the home port.

9. The method of claim 1, wherein in the standby time period, the nozzle is located in a home port, and
the method further includes an auto-dispensing operation of discharging a treatment liquid from the nozzle into the home port at set time intervals during the standby time period, and
the amount of treatment liquid discharged from the nozzle in the concentration adjustment operation is greater than the amount of treatment liquid discharged from the nozzle in the auto-dispensing operation.

10. A method of treating a substrate, the method comprising:
performing a treatment of removing a foreign material or a thin film from a substrate by supplying a treatment liquid stored in a main tank to the substrate directly or via another tank; and
recovering the treatment liquid used in the treatment of the substrate to the main tank directly or via still another tank and then reusing the recovered treatment liquid,
wherein the treatment liquid contains hydrogen peroxide and water,
the foreign material or thin film contains a metal,
a concentration adjustment operation of adjusting a concentration of the treatment liquid in the main tank is performed in a standby time period in which the substrate is not treated with the treatment liquid, and
in the concentration adjustment operation, the treatment liquid in a heated state is discharged from the nozzle, the discharged treatment liquid is recovered to the main tank, and the concentration of the hydrogen peroxide is increased by evaporation of water from the treatment liquid while the treatment liquid is discharged from the nozzle.

11. The method of claim 10, wherein the treatment of the substrate is performed by supplying the treatment liquid from the nozzle to the substrate supported by a support unit in a cup, and
in the concentration adjustment operation, the treatment liquid is discharged into the cup.

12. The method of claim 11, wherein in the concentration adjustment operation, the treatment liquid is supplied to an upper surface of the support unit or an upper surface of a dummy wafer in a state in which the substrate is not provided into the cup or the dummy wafer is provided to the support unit.

13. The method of claim 10, wherein in the standby time period, the nozzle is located in a home port, and
in the concentration adjustment operation, the treatment liquid is supplied from the nozzle to the home port.

14. The method of claim 10, wherein in the standby time period, the nozzle is located in a home port, and
the method further includes an auto-dispensing operation of discharging a treatment liquid from the nozzle to the home port at set time intervals during the standby time period, and
the amount of treatment liquid discharged from the nozzle in the concentration adjustment operation is greater than the amount of treatment liquid discharged from the nozzle in the auto-dispensing operation.

15. The method of claim 10, wherein the metal includes titanium.

16. The method of claim 10, wherein the concentration adjustment operation is performed when a concentration of the treatment liquid in the treatment liquid stored in the main tank is measured, and the measured concentration of the treatment liquid is lower than a set concentration.

\* \* \* \* \*